United States Patent
Hayhow et al.

(10) Patent No.: US 7,581,148 B2
(45) Date of Patent: Aug. 25, 2009

(54) SYSTEM, METHOD AND APPARATUS FOR COMPLETING THE GENERATION OF TEST RECORDS AFTER AN ABORT EVENT

(75) Inventors: Reid Hayhow, La Porte, CO (US); Carli Connally, Fort Collins, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 235 days.

(21) Appl. No.: 11/345,211

(22) Filed: Jan. 31, 2006

(65) Prior Publication Data

US 2007/0180342 A1    Aug. 2, 2007

(51) Int. Cl.
*G01R 31/28*  (2006.01)
*G06F 11/00*  (2006.01)

(52) U.S. Cl. .................................. 714/724; 714/45
(58) Field of Classification Search ........... 714/738, 714/724, 45

See application file for complete search history.

(56) References Cited

U.S. PATENT DOCUMENTS

| | | | |
|---|---|---|---|
| 6,601,020 B1 * | 7/2003 | Myers | 702/186 |
| 6,775,644 B2 * | 8/2004 | Myers | 702/186 |
| 2003/0084413 A1 * | 5/2003 | Varney | 716/4 |
| 2003/0237032 A1 * | 12/2003 | Adler et al. | 714/718 |
| 2004/0039550 A1 * | 2/2004 | Myers | 702/186 |
| 2004/0059970 A1 * | 3/2004 | Wieberdink et al. | 714/724 |
| 2006/0143535 A1 * | 6/2006 | Lu et al. | 714/38 |

* cited by examiner

*Primary Examiner*—James C Kerveros
(74) *Attorney, Agent, or Firm*—Holland & Hart, LLP

(57) ABSTRACT

A system for formatting test data includes at least one data formatter to retrieve test data from a data store, upon receiving notifications of test events, and to generate a number of test records based on the test data. The system further includes an abort handler to cause at least one of the data formatters to complete the generation of its number of test records based on currently available test data in the data store, in response to an abort event.

24 Claims, 3 Drawing Sheets

```
TestEvent:AppModelLevelStartEvent // e.g., lot number #10000012
    TestEvent:AppModelLevelStartEvent // e.g., DUT #000001
        TestEvent:TestflowStartEvent // e.g., test flow #100
            TestEvent:TestSuiteStartEvent // e.g., test suite #33 (pin 10)
                TestEvent:TestFunctionStartEvent // e.g., voltage test
                    TestResult1 // e.g., result1= 4.7
                    TestResult2 // e.g., result2= 5.1
                    TestResult3 // e.g., result3= 4.9
                TestEvent:TestFunctionEndEvent
                TestEvent:TestFunctionStartEvent // e.g., mA test
                    TestResult1 // e.g., result1= 0.3
                    TestResult2 // e.g., result2= 0.1
                    TestResult3 // e.g., result3= 0.2
                TestEvent:TestFunctionEndEvent
            TestEvent:TestSuiteEndEvent
        TestEvent:TestFlowEndEvent
    TestEvent:AppModelLevelEndEvent
TestEvent:AppModelLevelEndEvent
TestEvent:TestProgramEndEvent
```

SYSTEM, METHOD AND APPARATUS FOR COMPLETING THE GENERATION OF TEST RECORDS AFTER AN ABORT EVENT

BACKGROUND

When testing a circuit, test results may be logged in a "raw" format. Often, this raw format is 1) not accepted by the application programs that are used to analyze the test results, and 2) difficult for test engineers and others persons to comprehend.

As a result of the above difficulties that a raw data format presents, raw data is often converted to one or more other formats by, for example, rearranging, sorting, grouping, distilling and/or performing other operations on the data.

When an error is encountered while generating or storing raw data, "in process" data formatting operations are often abruptly terminated, and test records that may have been usable are often corrupted or lost. The corruption or loss of these records can lead to significant delays in testing and/or the needless repetition of work—especially in cases where data formatting operations have been "in process" for many hours, and the partial records generated thereby would have contained enough information to enable a user to avoid having to repeat their generation.

SUMMARY OF THE INVENTION

In one embodiment, a system for formatting test data comprises at least one data formatter to i) upon receiving notifications of test events, retrieve test data from a data store, and ii) generate a number of test records based on the test data. The system also comprises an abort handler to, in response to an abort event, cause at least one of the data formatters to complete the generation of its number of test records based on currently available test data in the data store.

In another embodiment, a method for formatting test data comprises 1) upon receiving notifications of test events, retrieving test data from a data store and generating a number of test records based on the test data; and 2) in response to an abort event, completing the generation of the number of test records based on currently available test data in the data store.

In yet another embodiment, a number of machine-readable media have stored thereon sequences of instructions that, when executed by a machine, cause the machine to perform the actions of: 1) causing at least one data formatter to i) upon receiving notifications of test events, retrieve the test data from a data store, and ii) generate a number of test records based on the test data; and 2) causing an abort handler to, in response to receiving an abort event, cause at least one of the data formatters to complete the generation of its number of test records based on currently available test data in the data store.

Other embodiments are also disclosed.

BRIEF DESCRIPTION OF THE DRAWINGS

Illustrative embodiments of the invention are illustrated in the drawings, in which:

FIG. 3 illustrates an exemplary order and relationship of test events that may be processed by the method and system shown in FIGS. 1 and 2.

DETAILED DESCRIPTION

As mentioned in the Background, raw test data often needs to be converted to one or more other formats by, for example, rearranging, sorting, grouping, distilling and/or performing other operations on the data.

Figure 1:
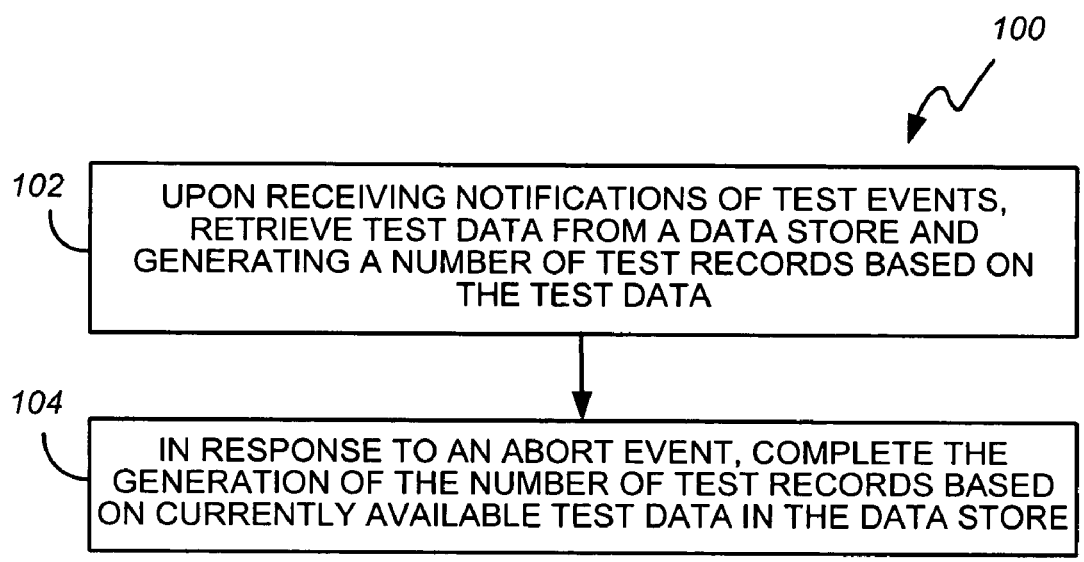
FIG. 1 illustrates an exemplary method for formatting test data.

In the past, there have been events which have led to the abort of data formatting operations, including, for example, failure or reboot of a test data source (e.g., a tester); failure of a test program; corruption of the test data that is produced by the test data source (including missing test data and/or incomplete test data); failure (including corruption) of a data store in which the test data is stored; and failure of one or more processes that acquire and pass (or store) the test data. Upon the occurrence of one of these abort events, the records produced as a result of data formatting operations have typically been corrupted or lost. This is unfortunate, as the "partial records" that were generated before the abort event might sometimes have contained enough information to enable a user to avoid having to repeat their generation. In recognition of this fact, FIG. 1 illustrates a new method 100 for formatting test data.

Figure 2:
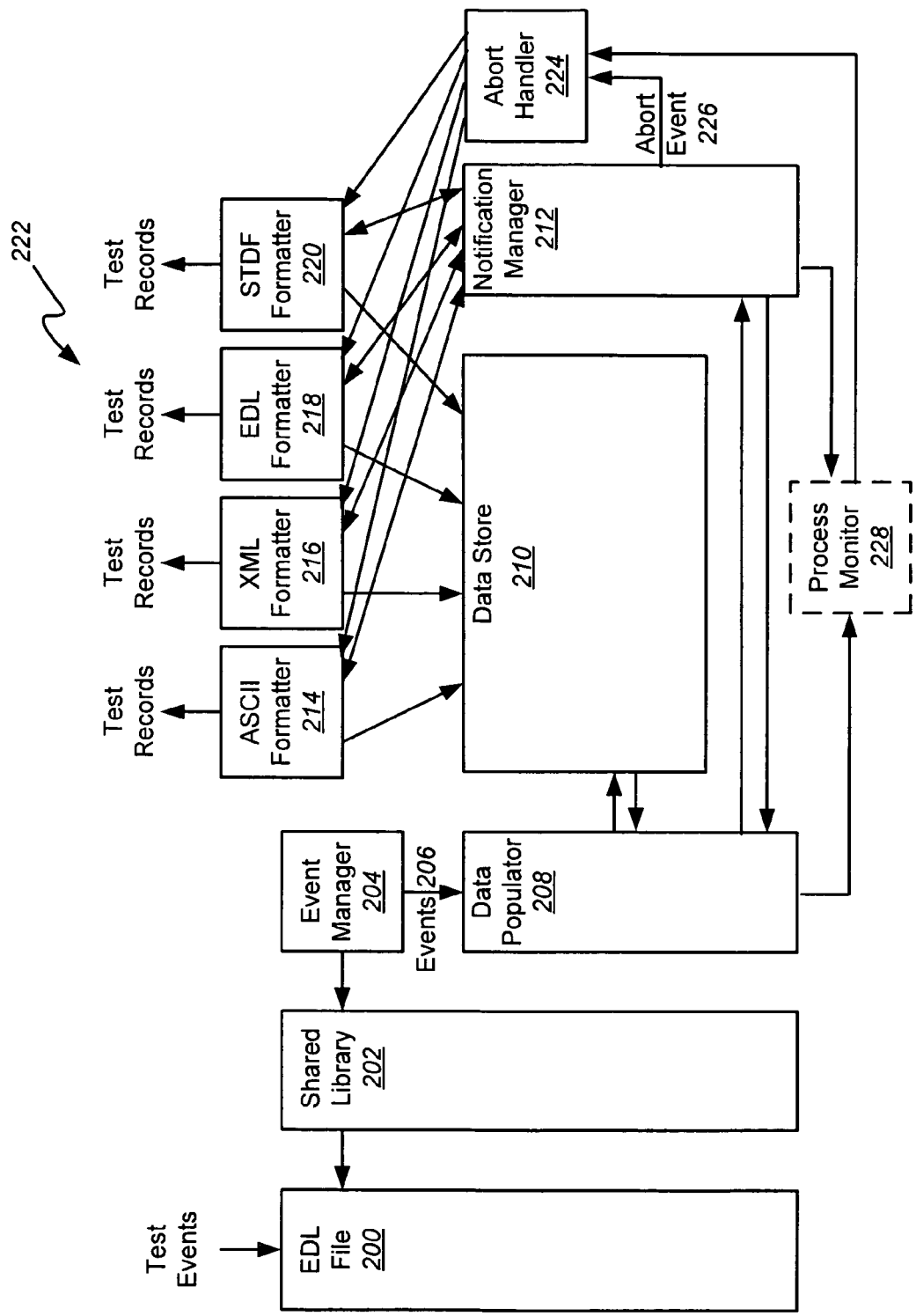
FIG. 2 illustrates an exemplary system for formatting test data.

The method 100 comprises 1) upon receiving notifications of test events, retrieving 102 test data from a data store and generating a number of test records based on the test data; and 2) in response to an abort event, completing 104 the generation of the number of test records based on currently available test data in the data store. Operation of the method 100 can be better understood in the context of an exemplary system 222 for implementing the method 100, as shown in FIG. 2.

The system 222 comprises a number of data formatters 214, 216, 218, 220 to 1) upon receiving notifications of test events, retrieve test data from a data store 210, and 2) generate a number of test records based on the test data. The system 222 also comprises an abort handler 224 to, in response to an abort event 226, cause at least one of the data formatters 214, 216, 218, 220 to complete the generation of its number of test records based on currently available test data in the data store 210.

In one embodiment, the system 222 is used to format data generated by the 93000 SOC Series tester offered by Agilent Technologies, Inc. The 93000 SOC Series tester (hereinafter referred to as the "93000 tester") is an SOC (System On a Chip) tester that generates a stream of sequential test data and logs the test data, including test events, to a binary data file known as an EDL (Event Data Logging) file 200. See FIG. 2. The events in this EDL file 200 correspond to the execution of a plurality of tests on at least one device under test (DUT), and are stored in an ordered sequence. However, the events stored in the EDL file 200 are not "thrown" to any other process, and are merely logged to the EDL file 200. In such an application, 1) a file corresponding to a plurality of events (e.g., an EDL file 200) may be parsed to retrieve the plurality of events, and then 2) the events retrieved from the data file may be passed to a process (e.g., the data populator 208) that creates a plurality of data objects and stores data in the data store 210 (e.g., a memory).

In one embodiment, the EDL file 200 is parsed in response to method calls made by an event manager 204. As shown in FIG. 2, the event manager 204 may make method calls (e.g., get event; get event attribute) to a shared library 202, and the shared library 202 may then retrieve events from the EDL file 200 and "throw" them to the event manager 204. The event manager 204 then passes the events 206 to the data populator 208.

The shared library 202 may take the form of compiled code, such as a data retrieval library (DRL), that executes a method or methods when called by the event manager 204.

The data populator 208 may store data objects in the data store 210, and then relate the data objects to one another, in a variety of ways. However, in one embodiment, they are related to one another in a hierarchical tree structure. Data objects that are children of other data objects may maintain pointers to their parent data objects, but parent objects need not maintain a list of pointers to all of their children. As will be explained later in this description, these pointers from children to their parents can aid the process of deleting data objects that are no longer needed.

Test data may be related to data objects in various ways, including, by 1) directly storing test data within the data objects, or 2) storing test data in data stores that are related to the data objects (e.g., related by pointers or other means).

In an EDL file 200, data is stored as attributes of events. Thus, if the data populator 208 receives events 206 drawn from an EDL file 200, the data populator 208 may extract test data corresponding to events by extracting the test data from attributes of the events. In the case of circuit test, the extracted data may comprise test results.

There are many ways in which the data formatters 214, 216, 218, 220 may access the data objects and test data that are created by the data populator 208. In one embodiment, the data formatters 214, 216, 218, 220 can simply monitor the data objects. However, this can require a lot of memory bandwidth, and is often not very efficient. In a preferred embodiment, the data populator 208 creates tokens that index the test data it creates, and then passes the tokens to a notification manager 212. The notification manager 212 then distributes ones of the tokens to ones of the data formatters 214, 216, 218, 220.

It is noted that that the notification manager 212 need only receive one token for each data object. The notification manager 212 can then replicate the token, or broadcast it, to each of the data formatters 214, 216, 218, 220. Alternately, the notification manager 212 may not replicate or broadcast the token for/to each of the data formatters 214, 216, 218, 220, and may only replicate or broadcast the token for/to certain ones of the data formatters 214, 216, 218, 220 that have subscribed for a type of data item that is represented by the data object.

Typically, the operation of the data populator 208 will be given priority over the operation of the data formatters 214, 216, 218, 220. To further control access to the memory 210 in which the data objects and data are stored, the data populator 208 may be provided with direct access to the data objects and the test data. However, the number of data formatters 214, 216, 218, 220 may be provided with access to the plurality of data objects via a structured interface that coordinates/arbitrates the data formatters' access to the data objects and data.

The data formatters shown in FIG. 2 may take various forms, including forms such as an ASCII (American Standard Code for Information Interchange) formatter 214, an XML (eXtensible Markup Language) formatter 216, an EDL formatter 218 and/or an STDF (Standard Test Definition Format) formatter 220.

It is understood that various programming languages, paradigms, and hardware platforms may be used to implement the teachings herein. In one embodiment, object-oriented programming techniques are employed to develop the data objects stored in the data store 210 (FIG. 2). In another embodiment, a procedural language is employed to develop the data elements and processing logic.

Turning back now to the handling of an abort event, it is noted that the system 222 is provided with an abort handler 224. As shown in FIG. 2, the abort handler 224 may be instantiated apart from the data formatters 214, 216, 218, 220. Alternately, the functionality of the abort handler 224 may be integrated with one or more of the data formatters 214, 216, 218, 220.

The abort handler 224 may cause ones of the data formatters 214, 216, 218, 220 to complete the generation of their test records in a number of ways. In one embodiment, the abort handler 224 does this by maintaining current state information pertaining to test events that have been received by the data populator 208 or the notification manager 212. Then, and upon receiving an abort event 226, the abort handler 224 provides its current state information to any of the data formatters 214, 216, 218, 220 that need to complete the generation of their test records.

Although it was previously indicated that the test events 206 (FIG. 2) are derived from an EDL file 200 which contains an ordered sequence of test events, the system 222 can be used to process test events derived from other sources. However, assuming that the system 222 is used to process EDL-type events, or other sequential test events, an exemplary order and relationship of these events 300 is shown in FIG. 3. Note that each "start event" is subsequently followed by a corresponding "end event", with some number of test results falling therebetween (and possibly within nested pairs of test events, as shown). When test events are paired in this manner (whether in an EDL file or other source of test events), the abort handler 224 may maintain current state information regarding "start events" that have not been paired with "end events" (i.e., event pairs that have not yet been closed). This information regarding unclosed event pairs may then be used to cause ones of the data formatters 214, 216, 218, 220 to complete the generation of their test records in the absence of one or more "end events". For example, the abort handler may in some cases just "throw" the "end events" that have not yet been received.

As shown in FIG. 2, the notification manager 212 may forward notifications of test events to the data formatters 214, 216, 218, 220. The notification manager 212 may also forward an abort event 226, if any, to the abort handler 224. In one embodiment, the notification manager 212 initially receives the abort event from the data populator 208. By way of example, the data populator 208 may pass the abort event to the notification manager 212 upon determining that a stream of sequential test data, including test events, is incomplete. The data populator 208 could also pass the abort event to the notification manager 212 upon determining that a test event in a stream of sequential test data is received out of order (e.g., because an intermediary pair of test events was not received, such as the events "TestEvent:AppModelLevelStartEvent// e.g., lot number #10000012" and "TestEvent:AppModelLevelEndEvent" shown in FIG. 3).

In one embodiment, the system 222 may comprise a process monitor 228. The process monitor 228 can monitor processes (including threads) that run the data populator 208, notification manager 212 and/or other processes (or threads). The process monitor 228 can also monitor structures such as the data store 210. Upon failure of one of its monitored processes or structures, the process monitor 228 can then pass an abort event to the abort handler 224.

In addition to the abort handler 224 helping the data formatters 214, 216, 218, 220 complete their generation of test records, in cases where the data populator 208 remains functional, it too can help the data formatters 214, 216, 218, 220 complete the generation of test records. For example, and upon an abort event, the data populator 208 may complete any test data summary information that is stored in the data store 210. Although all of the test data on which the summary information may have been based may not be available, the data populator 208 may complete the summary information based on currently available test data in the data store 210.

Completion of this summary information can be especially useful for formatters such as the STDF formatter 220 to complete the generation of meaningful test records.

The system 200 and method 100 described herein may be substantially implemented by means of sequences of instructions stored on machine-readable media that, when executed by a machine, cause the machine to perform the actions of the method 100. The machine-readable media may include, for example, any number or mixture of fixed or removable media (such as one or more fixed disks, random access memories (RAMs), read-only memories (ROMs), or compact discs), at either a single location or distributed over a network. The sequences of instructions will typically comprise software, but could also comprise firmware.

What is claimed is:

1. A system for formatting test data, comprising:
    at least one data formatter to i) upon receiving notifications of test events, retrieve test data from a data store, and ii) generate a number of test records based on the test data; and
    an abort handler to, in response to an abort event, cause at least one of the data formatters to complete the generation of the number of test records of the least one of the data formatters, based on currently available test data in the data store.

2. The system of claim 1, wherein the abort handler i) maintains current state information pertaining to the test events, and ii) upon receiving the abort event, provides the current state information to any of the data formatters that needs to complete the generation of the number of test records of the least one of the data formatters.

3. The system of claim 1, wherein:
    the test events form test event pairs, with each test event pair comprising a start event and an end event that bound a set of test results; and
    the at least one of the data formatters is caused to complete the generation of the number of test records of the least one of the data formatters, in the absence of at least one of the end events.

4. The system of claim 3, wherein the abort handler i) maintains current state information pertaining to start events that have not been paired with end events, and ii) upon receiving the abort event, provides the current state information to any of the data formatters that needs to complete generation of the number of test records of the least one of the data formatters.

5. The system of claim 1, further comprising a notification manager to i) forward the notifications of the test events to the at least one data formatter, and ii) forward the abort event to the abort handler.

6. The system of claim 5, wherein the notification manager forwards the notifications of the test events to the data formatter(s) by passing tokens, which reference the test events in the data store, to the data formatter(s).

7. The system of claim 5, further comprising a data populator to i) receive a stream of sequential test data, the stream comprising the test data and the test events, ii) write the test data to the data store, and iii) pass notifications of the test events to the notification manger.

8. The system of claim 7, wherein the data populator further passes the abort event to the notification manager.

9. The system of claim 8, wherein the data populator passes the abort event to the notification manager upon determining that the stream of sequential test data is incomplete.

10. The system of claim 8, wherein the data populator passes the abort event to the notification manager upon determining that a test event in the stream of sequential test data is received out of order.

11. The system of claim 7, further comprising a process monitor to pass the abort event to the abort handler upon a failure of the data populator.

12. The system of claim 7, wherein, upon the abort event, the data populator completes summary information stored in the data store, the summary information being completed based on the currently available test data in the data store.

13. The system of claim 1, further comprising a process monitor to pass the abort event to the abort handler upon a failure of the data store.

14. The system of claim 1, wherein the abort handler is integrated with one of the data formatters.

15. A method for formatting test data, comprising:
    upon receiving notifications of test events, retrieving test data from a data store and generating a number of test records based on the test data; and
    in response to an abort event, completing the generation of the number of test records based on currently available test data in the data store.

16. The method of claim 15, further comprising:
    maintaining current state information pertaining to the test events; and
    upon receiving the abort event, using the current state information to complete the generation of the number of test records.

17. The method of claim 15, wherein:
    the test events form test event pairs, with each test event pair comprising a start event and an end event that bound a set of test results; and
    completing the generation of the number of test records in the absence of at least one of the end events.

18. The method of claim 17, further comprising:
    maintaining current state information pertaining to start events that have not been paired with end events; and
    upon receiving the abort event using the current state information to complete generation of the number of test records.

19. The method of claim 15, further comprising:
    receiving a stream of sequential test data, the stream comprising the test data and the test events;
    writing the test data to the data store; and
    generating the abort event upon determining that the stream of sequential test data is incomplete.

20. The method of claim 15, further comprising:
    receiving a stream of sequential test data, the stream comprising the test data and the test events;
    writing the test data to the data store; and
    generating the abort event upon determining that a test event in the stream of sequential test data is received out of order.

21. The method of claim 15, further comprising, upon the abort event, completing summary information stored in the data store, the summary information being completed based on currently available test data in the data store.

22. A number of machine-readable media having stored thereon sequences of instructions that, when executed by a machine, cause the machine to perform the actions of:
    causing at least one data formatter to i) upon receiving notifications of test events, retrieve the test data from a data store, and ii) generate a number of test records based on the test data; and
    causing an abort handler to, in response to receiving an abort event, cause at least one of the data formatters to complete the generation of the number of test records of the least one of the data formatters, based on currently available test data in the data store.

23. The number of machine-readable media of claim 22, wherein the sequences of instructions, when executed by the machine, further cause the machine to perform the action of:

upon the abort event, completing summary information stored in the data store, the summary information being completed based on currently available test data in the data store.

24. The number of machine-readable media of claim 22, wherein the sequences of instructions, when executed by the machine, further cause a process monitor to pass the abort event to the abort handler upon a failure of the data store.

* * * * *